(12) United States Patent
Komiya et al.

(10) Patent No.: US 7,259,483 B2
(45) Date of Patent: Aug. 21, 2007

(54) LINEAR DRIVING MECHANISM OF ELECTRONIC COMPONENTS MOUNTING APPARATUS

(75) Inventors: Takahiro Komiya, Fukuoka (JP); Kazuhide Nagao, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 300 days.

(21) Appl. No.: 10/922,664

(22) Filed: Aug. 20, 2004

(65) Prior Publication Data
US 2005/0040713 A1 Feb. 24, 2005

(30) Foreign Application Priority Data
Aug. 20, 2003 (JP) ............... 2003-296064

(51) Int. Cl.
*H02K 41/00* (2006.01)
*H02K 9/00* (2006.01)
*H02K 5/00* (2006.01)
(52) U.S. Cl. .................................... 310/12; 310/17
(58) Field of Classification Search .................. 310/12, 310/13, 16
See application file for complete search history.

(56) References Cited

U.S. PATENT DOCUMENTS 5,994,799 A * 11/1999 Mehdianpour ............ 310/12
6,724,104 B2 * 4/2004 Katsuki et al. ............ 310/12

FOREIGN PATENT DOCUMENTS

| DE | 198 57 331 | | 1/2001 |
|---|---|---|---|
| EP | 1 246 520 A2 | | 10/2002 |
| JP | 2001169529 A | * | 6/2001 |
| WO | WO 2004004100 A1 | * | 1/2004 |

* cited by examiner

Primary Examiner—Karl Tamai
Assistant Examiner—Erik Preston
(74) Attorney, Agent, or Firm—Pearne & Gordon LLP

(57) ABSTRACT

In a Y linear driving mechanism 6 for moving an X linear driving mechanism 8 in a direction Y by a linear motor comprising a stator 16 and a moving element 17, there is provided a drive transmission portion which is connected to the moving element 17 so as to transmit a driving force of the moving element 17, acting in the direction Y, through a moving plate 18 and a connecting member 25. A first air gap G1 is formed between the moving element 17 and the moving plate 18, and a second air gap G2 is formed between the moving plate 18 and the connecting member 25. With this construction, the transfer of heat from the moving element 17 is interrupted in an operating condition, so that troubles, caused by the thermal expansion and contraction due to heat generated by the linear motor, can be prevented.

5 Claims, 4 Drawing Sheets

LINEAR DRIVING MECHANISM OF ELECTRONIC COMPONENTS MOUNTING APPARATUS

BACKGROUND OF THE INVENTION

This invention relates to a linear driving mechanism which is provided in an electronic components mounting apparatus such as an electronic component placement machine, and linearly drives a driven member such as a mounting head by a linear motor.

In electronic components mounting apparatuses such as an electronic components placement machine, a linear driving mechanism has been extensively used as an elemental mechanism forming a head-moving mechanism for moving an operating head such as a mounting head. In recent years, instead of a conventional linear driving mechanism of the type in which a rotational motion of a motor is converted into a linear motion by a ball screw, there has been used the type of linear driving mechanism in which a linear motion is directly effected by a linear motor (see, for example, JP-A-2002-299896). By adopting this type, there is achieved the linear driving mechanism capable of effecting a high-speed operation with high positional accuracy.

A linear motor is of such a type that a magnetic force is produced between a stator, mounted in a driving direction, and a moving element disposed in opposed relation to the stator, thereby obtaining a driving force. Therefore, the moving element is always kept in a heated condition by a drive current. Therefore, heat is transferred from the moving element to a drive transmission portion interconnecting a driven member and the moving element, and is further transferred to the driven member, so that the temperature of this driven member rises. When the driven member is subjected to thermal expansion and contraction because of this temperature rise, there has been encountered a problem that various troubles, such as lowered precision of positioning of the operating head mounted on the driven member, are incurred.

SUMMARY OF THE INVENTION

It is therefore an object of this invention to provide a linear driving mechanism of an electronic components-mounting apparatus which is capable of preventing troubles caused by the thermal expansion and contraction due to generated heat.

According to the present invention, there is provided a linear driving mechanism for being provided in an electronic components mounting apparatus used to mount electronic components on a circuit board and for linearly driving a driven member in a first direction, in that the linear driving mechanism comprises a guide portion for guiding the driven member in the first direction, a linear motor for linearly driving the driven member in the first direction, having a stator and a moving element which are arranged in the first direction, a stator holding portion fixedly holding the stator in the first direction, and a drive transmission portion which is connected to the moving element so as to transmit a driving force of the moving element, acting in the first direction, to the driven member; and an air gap for interrupting a heat transfer is formed between the moving element and the drive transmission portion and/or between the drive transmission portion and the driven member.

According to the present invention, the air gap for interrupting a heat transfer is formed between the moving element and the drive transmission portion and/or between the drive transmission portion and the driven member, and with this construction troubles, caused by the thermal expansion and contraction due to heat generated by the linear motor, can be prevented.

DETAILED DESCRIPTION OF THE PREFERRED EMBODIMENTS

A preferred embodiment of the present invention will now be described with reference to the drawings.

Figure 1:
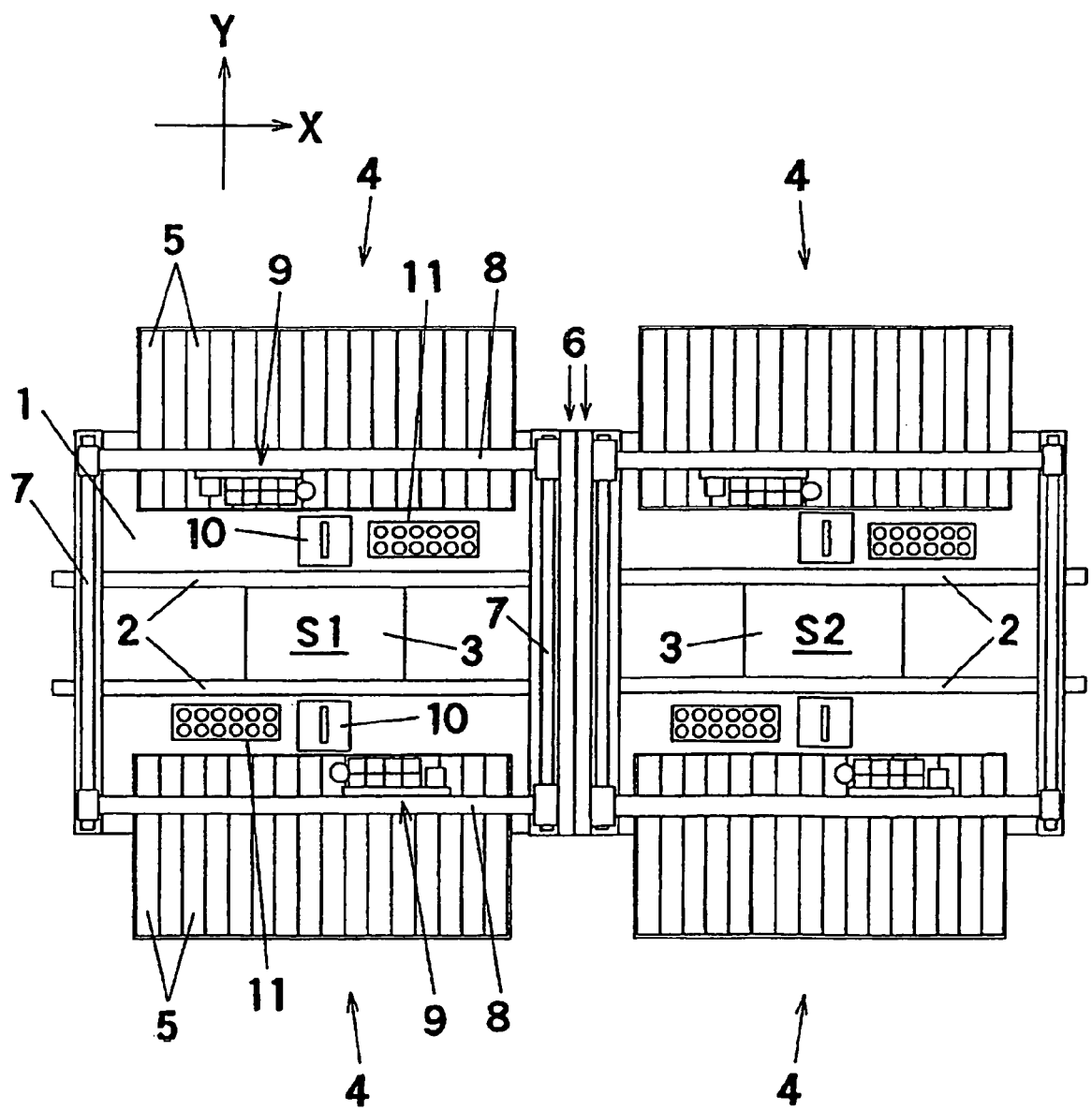
FIG. 1 is a plan view showing one preferred embodiment of an electronic components mounting apparatus of the invention.

First, the structure of the electronic components mounting apparatus will be described with reference to FIGS. 1 and 2. In FIG. 1, a conveyer path 2 is provided on a base 1 of the electronic components mounting apparatus, and extends in a direction X. The conveyer path 2 transfers a board 3 on which electronic components are mounted, and this conveyer path 2 positions the board 3 in each of two stages S1 and S2 set on the conveyer path 2. Each of the mounting stages S1 and S2 comprises parts supply portions 4, each having a plurality of juxtaposed parts feeders 5, provided respectively at opposite sides thereof, and a mounting mechanism for taking electronic components from the parts-supply portions 4 and for mounting these parts on the board 3.

The mounting mechanism will be described. Two Y linear driving mechanisms 6 are provided between the mounting stages S1 and S2, and are disposed in a direction Y. The Y linear driving mechanism 6 is driven by a linear motor as described later. This linear driving mechanism moves X linear driving mechanisms 8, each guided at opposite ends thereof by two guide rails 7, in the direction Y. Similarly, the X linear driving mechanism 8 is driven by a linear motor, and this linear driving mechanism moves a mounting head 9 in the direction X.

Figure 2:
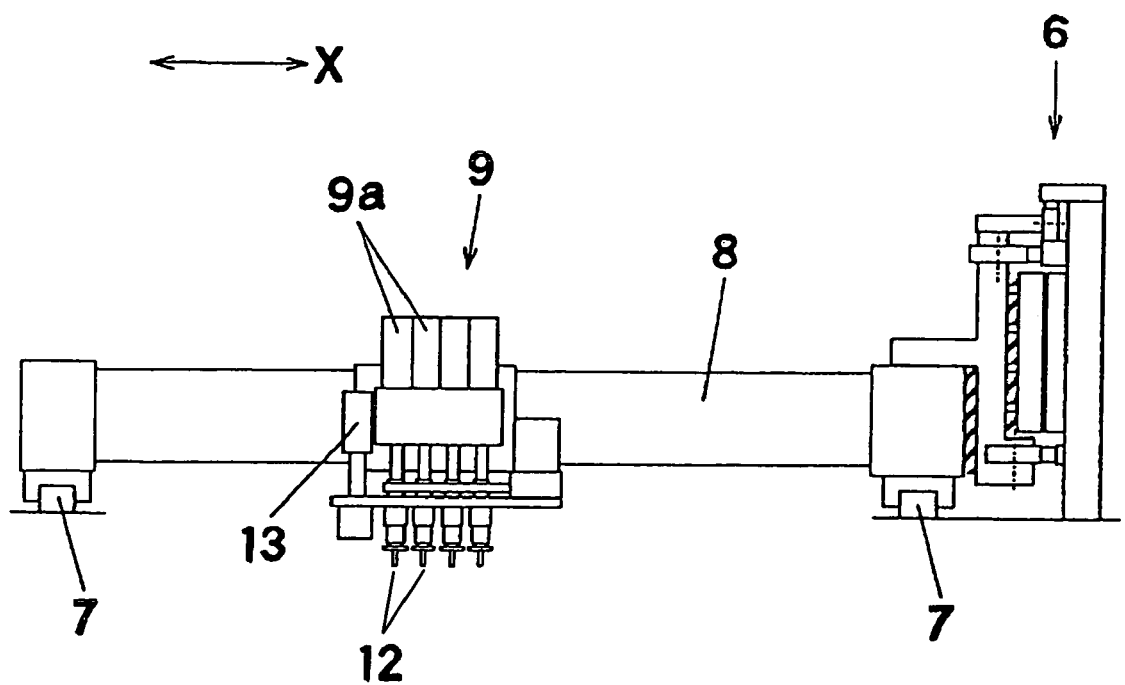
FIG. 2 is a cross-sectional view of the electronic components mounting apparatus of the invention.

As shown in FIG. 2, the mounting head 9 is a multi-type mounting head having a plurality of unit mounting heads 9*a*. Electronic components are suction-held respectively by suction nozzles 12 provided respectively at the unit mounting heads 9*a*. The mounting head 9 is provided with a board recognition camera 13 which is movable together with the mounting head 9. The board recognition camera 13 moves, together with the mounting head 9, into a position above the board 3, and recognizes the position of this board 3.

When the Y linear driving mechanism 6 and the X linear driving mechanism 8 are driven, the mounting head 9 is moved in the directions X and Y, and the mounting head 9 picks up the electronic components from the parts feeders 5 of the parts supply portion 4, and transfers the electronic components, and mounts them on the board 3. A line camera 10 and a nozzle stocker 11 are provided between the parts supply portion 4 and the conveyer path 2. When the mounting head 9, which has taken the electronic components from the parts supply portion 4, passes over the line camera 10, the electronic components, held by the mounting head 9, are recognized by this line camera 10. The suction nozzles 12 (corresponding respectively to the kinds of electronic components) which are to be attached to the mounting head 9 are stored in the nozzle stocker 11, and when the mounting head 9 makes access to the nozzle stocker 11, the suction nozzles 12 are automatically exchanged.

Next, the Y linear driving mechanism 6 will be described. The Y linear driving mechanism 6 is provided in the electronic components-mounting apparatus used for mounting the electronic components on the board, and this Y linear driving mechanism 6 has the function of linearly moving the X linear driving mechanism 8 (which is a driven structure) in the direction Y (first direction) by the linear motor, and includes the drive transmission portion for transmitting a driving force of the linear motor to the X linear driving mechanism 8.

Figure 3:
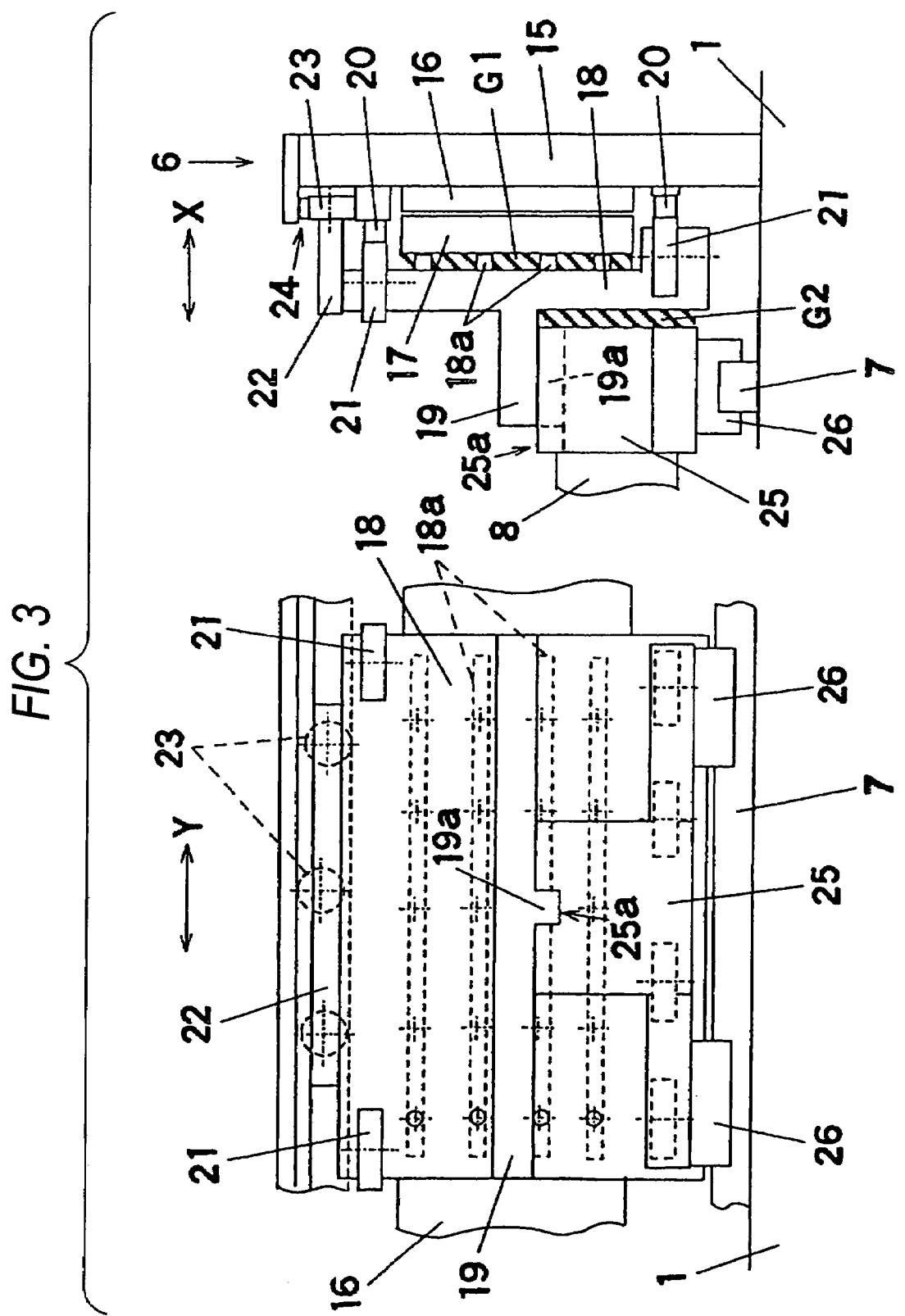
FIG. 3 is a view explanatory of the structure of a drive transmission portion of a moving beam of the electronic components mounting apparatus of the invention.

In FIG. 3, the guide rails 7 for guiding the X linear driving mechanism 8 in the direction Y are mounted on the base 1. Sliders 26 are slidably fitted on the guide rail 7, and are fixed to a lower surface of a connecting member 25 connected to the X linear driving mechanism 8. The guide rail 7, the sliders 26 and the connecting member 25 jointly serve as a guide portion for guiding the driven structure in the first direction.

Reference numeral 15 denotes a vertical bracket 15 which forms part of the Y linear driving mechanism, and this vertical bracket 15 is mounted in a vertical posture on the base 1, and extends in the direction Y (the first direction). A stator 16 of the linear motor (which comprises this stator 16 and a moving element 17 opposed to the stator 16) is fixed to a side surface of the vertical bracket 15. Namely, the vertical bracket 15 serves as a stator holding portion which fixedly holds the stator 16 in the direction Y. The linear motor, comprising the stator 16 and the moving element 17, is mounted in the direction Y in such a manner that the area of facing of the stator 16 and the moving element 17 each other is directed toward the driven structure (toward the X linear driving mechanism 8).

A moving plate 18 is connected to a rear surface of the moving element 17 (that is, that surface thereof facing away from the stator 16) through a spacer member 18a, and a first gap G1 which is equal to the thickness of the spacer member 18a is formed between the moving element 17 and the moving plate 18. The moving plate 18 is mounted in such a manner that a second gap G2 is formed between the moving plate 18 and the connecting member 25. A flange portion 19, formed on a rear surface of the moving plate 18, is disposed in contact with an upper surface of the connecting member 25. A projection 19a is formed on a lower surface of the flange portion 19, and this projection 19a is fitted in a groove 25a formed in the upper surface of the connecting member 25.

Here, the projection 19a is fitted in the groove 25a in such a manner that a force to restrain the flange portion 19 and the connecting member 25 does not act in the direction X, and a restraining force acts only in the direction Y. With this construction, a driving force of the moving element 17 acts in the direction Y, but a force, applied from the moving element 17 to the flange portion 19, will not be transmitted to the connecting member 25 as described later.

The flange portion 19 and the connecting member 25 are connected to the moving element 17, and serve as the drive transmission portion for transmitting the driving force of the moving element 17 (acting in the direction Y) to the X linear driving mechanism 8. This drive transmission portion is interposed between the moving element 17 and the X linear driving mechanism 8, and is designed to transmit only the force acting in the direction Y. The drive transmission portion is not limited to the above construction, and any other suitable mechanism than the combination of the projection 19a and the groove 25a can be adopted in so far as the restraining force does not act in the direction X, but acts only in the direction Y.

A plurality of guide rollers 21 are mounted at upper and lower end portions of the moving plate 18 in such a manner that axes of these guide rollers 21 are disposed vertically. The guide rollers 21 are held in contact with corresponding guide rails 20 mounted on the side surface of the vertical bracket 15 and extending in the direction Y. When the moving plate 18 is driven by the moving element 17, the guide rollers 21 roll along the corresponding guide rails 20.

A plurality of guide rollers 23 are mounted on a plate member 22, fixed to the upper end of the moving plate 18, in such a manner that axes of these guide rollers 23 are disposed horizontally. A guide groove 24 in which the guide rollers 23 are fitted is formed in the upper end portion of the vertical bracket 15, and extends in the direction Y. When the moving plate 18 moves together with the moving element 17, the guide rollers 23 roll in the guide groove 24. With this construction, the position of the moving plate 18 in a direction Z is maintained.

Figure 4:
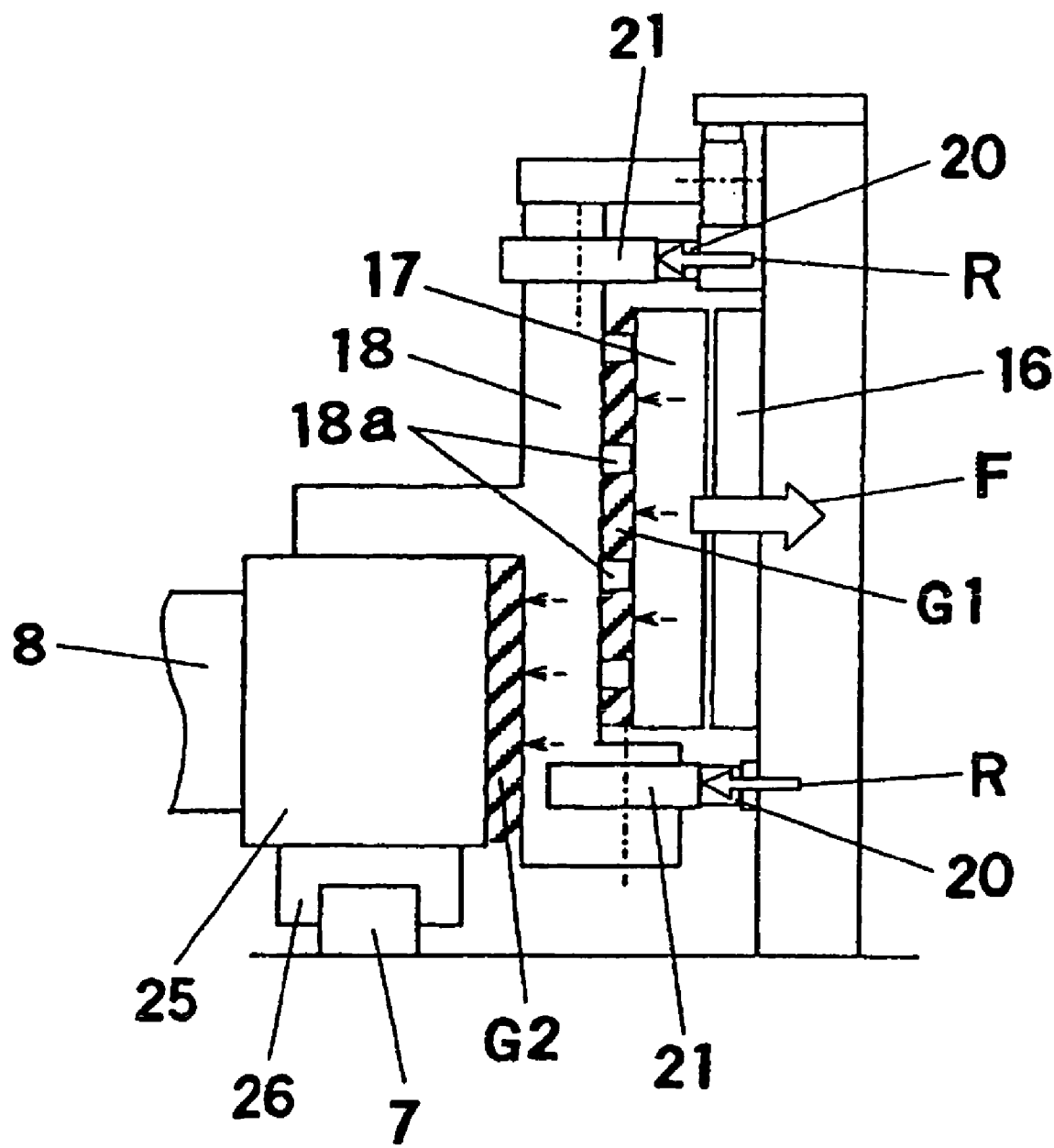
FIG. 4 is a cross-sectional view of the drive transmission portion of the moving beam of the electronic components mounting apparatus of the invention.

FIG. 4 shows a condition in which an attractive force F due to a magnetic force is exerted between the moving element 17 and the stator 16 during the operation of the linear motor. This attractive force F is supported by reaction forces R produced as a result of pressing of the guide rollers 21 against the guide rails 20. Namely, the guide rails 20 and the guide rollers 21 serve as an attractive force-supporting portion provided at the drive transmission portion so as to support the attractive force acting between the stator 16 and moving element 17 in the opposing direction. Therefore, the attractive force F will not act on sliding portions of the guide rails 7 and sliders 26, and even when the X linear driving mechanism 8 moves at high speed in the direction Y, these sliding portions will not operate under a heavy load, so that a long lifetime of the component parts can be secured.

During the operation of the linear motor, the moving element 17 is always kept in a heated condition by a drive current. Therefore, heat is transferred from the moving element 17 to the moving plate 18 and the connecting portion 25, and is further transferred to the X linear driving mechanism 8, so that the temperature of this X linear driving mechanism rises. The structural members of the X linear driving mechanism 8 are thermally expanded by this temperature rise, and then are thermally contracted when they are cooled, thus repeating the thermal expansion and contraction. This thermal expansion and contraction incur various troubles such as lowered precision of positioning of the mounting head 9 mounted on the X linear driving mechanism 8.

In this embodiment, the first gap G1 is formed between the moving element 17 and the moving plate 18, and the transfer of heat from the moving element 17 to the moving plate 18 is effected only via the spacer member 18a. Therefore, the heat transfer is suppressed as compared with a construction in which the moving element 17 is disposed in direct contact with the moving plate 18. Similarly, the second gap G2 is formed between the moving plate 18 and the connecting member 25, and therefore the transfer of heat from the moving plate to the connecting member 25 is also suppressed.

Therefore, heat, generated by the moving element 17 during the operation of the linear motor, is prevented from being transferred to the X linear driving mechanism 8. Also, in the moving operation in which the moving plate 18 moves together with the moving element 17, the moving element 17, the moving plate 18 and the connecting member 25 are cooled by an air-cooling effect obtained when the air flows through the first air gap G1 and the second air gap G2, and the troubles, caused by the thermal expansion and contraction due to the generated heat, are prevented.

In the above example, although the Y linear driving mechanism 6 has been described, a similar construction is applied to the X linear driving mechanism 8 for moving the mounting head 9. Namely, in an example in which the invention is applied to the X linear driving mechanism 8, the direction X is a first direction, and the mounting head is a driven structure or member. In this embodiment, although the electronic components mounting apparatus for mounting the electronic components on the board is illustrated as the electronic components-mounting apparatus, the invention can be applied to a mounting apparatus forming an electronic components-mounting line, such as a screen printing apparatus.

The linear driving mechanism, provided in the electronic components mounting apparatus of the invention, has an advantage that it can prevent the troubles caused by the thermal expansion and contraction due to the generation of heat from the linear motor, and is effectively used as the linear driving mechanism for linearly driving the driven member such as the mounting head mounted in the electronic components-mounting apparatus such as the electronic components mounting apparatus.

What is claimed is:

1. A linear driving mechanism for being provided in an electronic components mounting apparatus used to mount electronic components on a board and for linearly driving a driven member in a first direction, said linear driving mechanism comprising:

a guide portion for guiding said driven member in said first direction;

a linear motor for linearly driving the driven member in the first direction, having a stator and a moving element which are arranged in said first direction;

a stator holding portion fixedly holding said stator in said first direction;

a drive transmission portion which is connected to said moving element so as to transmit a driving force of said moving element, acting in said first direction, to said driven member;

an air gap for interrupting a heat transfer being formed between said moving element and said drive transmission portion; and another air gap formed within the drive transmission portion for interrupting a heat transfer.

2. A linear driving mechanism according to claim 1, wherein said moving element and said drive transmission portion are connected together through a spacer member.

3. A linear driving mechanism according to claim 2, characterized in that said air gap between said moving element and said drive transmission portion is equal to a thickness of said spacer member.

4. A linear driving mechanism according to claim 1, wherein said drive transmission portion is interposed between said moving element and said driven member, and is designed to exert a restraining force only in said first direction.

5. A linear driving mechanism according to claim 1, wherein when said drive transmission portion moves together with said moving element, air flows through at least one of said air gap and said another air gap.

* * * * *